United States Patent [19]

Kolm et al.

[11] Patent Number: 4,461,968

[45] Date of Patent: Jul. 24, 1984

[54] PIEZOELECTRIC RELAY WITH MAGNETIC DETENT

[75] Inventors: Eric A. Kolm, Brookline; Henry H. Kolm, Wayland, both of Mass.

[73] Assignee: Piezo Electric Products, Inc., Cambridge, Mass.

[21] Appl. No.: 338,228

[22] Filed: Jan. 11, 1982

[51] Int. Cl.[3] .............................................. H01L 41/00

[52] U.S. Cl. .................................... 310/332; 200/181; 310/330

[58] Field of Search ............... 310/332, 311, 330, 331; 200/181; 335/79, 86, 229, 234, 170

[56] References Cited

U.S. PATENT DOCUMENTS

| | | | |
|---|---|---|---|
| 3,711,749 | 1/1973 | Koblents et al. | 335/154 |
| 3,914,723 | 10/1975 | Goodbar | 335/170 |
| 4,383,195 | 5/1983 | Kolm et al. | 310/332 |
| 4,387,318 | 6/1983 | Kolm et al. | 310/330 |

FOREIGN PATENT DOCUMENTS

| | | | |
|---|---|---|---|
| 2811524 | 9/1979 | Fed. Rep. of Germany | 310/332 |
| 1096824 | 12/1967 | United Kingdom | 200/181 |
| 565333 | 8/1977 | U.S.S.R. | 200/181 |

*Primary Examiner*—William M. Shoop
*Assistant Examiner*—D. Rebsch
*Attorney, Agent, or Firm*—Joseph S. Iandiorio

[57] ABSTRACT

A magnetically detented piezoelectric relay including a piezoelectric bender element having a fixed portion and a movable portion; means for providing an actuating voltage to deflect the bender element; first contact means mounted on the movable portion; second stationary contact means remote from the bender element and proximate the first contact means for selective engagement therewith in response to deflection of the bender element; and magnetic circuit means including a magnet, pole means, and magnetic means on the movable portion of the bender element for magnetically adhering the movable portion to the pole means until the deflection force of the bender element exceeds the holding force of the magnetic circuit.

12 Claims, 6 Drawing Figures

PIEZOELECTRIC RELAY WITH MAGNETIC DETENT

FIELD OF INVENTION

This invention relates to a magnetically detented piezoelectric relay.

BACKGROUND OF INVENTION

Piezoelectric relays driven by piezoelectric bending elements may employ a snap-action or bistable device to accumulate energy supplied by the piezoelectric bending element. See Ser. No. 200,390, filed Oct. 24, 1980, now U.S. Pat. No. 4,383,195 incorporated herein by reference. The full drive voltage is applied initially. When sufficient energy is stored, actuation occurs, whereupon the snap-action device produces quick, decisive operation.

In some applications full drive voltage is not initially available. The drive voltage is a slowly varying control voltage, such as encountered in automatic street light systems, which must nevertheless produce a quick, positive actuation when the operating voltage is reached. For example, relays used to turn street lights on and off at dusk and dawn must operate consistently at a predetermined voltage level of the slowly varying control voltage from a photosensitive element. The switching should occur at a relatively high level of illumination well above the condition of total darkness. The switching must be abrupt and positive to prevent contact chatter and consequent arcing and deterioration of the contacts.

Attempts to use a snap-action device in combination with a piezoelectric bending element resulted in less than desired response. The contact force becomes zero before the contacts open and a part of the actuating stroke is dissipated in premature motion as the contacts start to close. The mechanical detenting action of the snap-action device or overcenter spring device is not adequate: it introduces an amount of motion which is significant relative to the available contact stroke.

SUMMARY OF INVENTION

It is therefore an object of this invention to provide an improved piezoelectric relay which provides a quick, decisive action to positively open and close electrical contacts.

It is a further object of this invention to provide such an improved piezoelectric relay utilizing an improved detenting technique without the need for costly or complex mechanical arrangements.

It is a further object of this invention to provide such an improved piezoelectric relay which uses a magnetic detent.

The invention results from the realization that a truly effective piezoelectric relay with sharp switching action can be accomplished by using a magnetic detent to restrain the motion of the contacts until a predefined switching force level is attained.

The invention features a magnetically detented piezoelectric relay. It includes a piezoelectric bender element having a fixed portion and a movable portion. There are means for providing an actuating voltage to deflect the bender element. First contact means are mounted on the movable portion; second stationary contact means, remote from the bender element and proximate the first contact means, selectively engage with the first contact means in response to the deflection of the bender element. Magnetic circuit means include a magnet, pole means, and magnetic means on the movable portion for magnetically adhering the movable portion to the pole means until the deflection force of the bender element exceeds the holding force of the magnetic circuit.

In a preferred embodiment the first and second contact means are in the magnetic circuit. The magnetic means may be included in the first contact means, and the second contact means may be mounted on the pole means and may include magnetic material. The magnet may be a permanent magnet or an electromagnet. The means for providing an actuating voltage may include electrode means, and may further include a voltage source.

The first contact means may include a first contact member on the movable portion on the side facing the second contact means, and a second contact member on the opposite side of the movable portion, and third contact means remote from the bender element and proximate the second contact means for selective engagement therewith. The pole means may include a pole member on one side of the movable portion proximate the magnetic means, or may include a pair of spaced pole members for receiving in the space between them the movable portion of the bender element bearing the magnetic means.

DISCLOSURE OF PREFERRED EMBODIMENT

Other objects, features and advantages will occur from the following description of a preferred embodiment and the accompanying drawings, in which.

Figure 1:
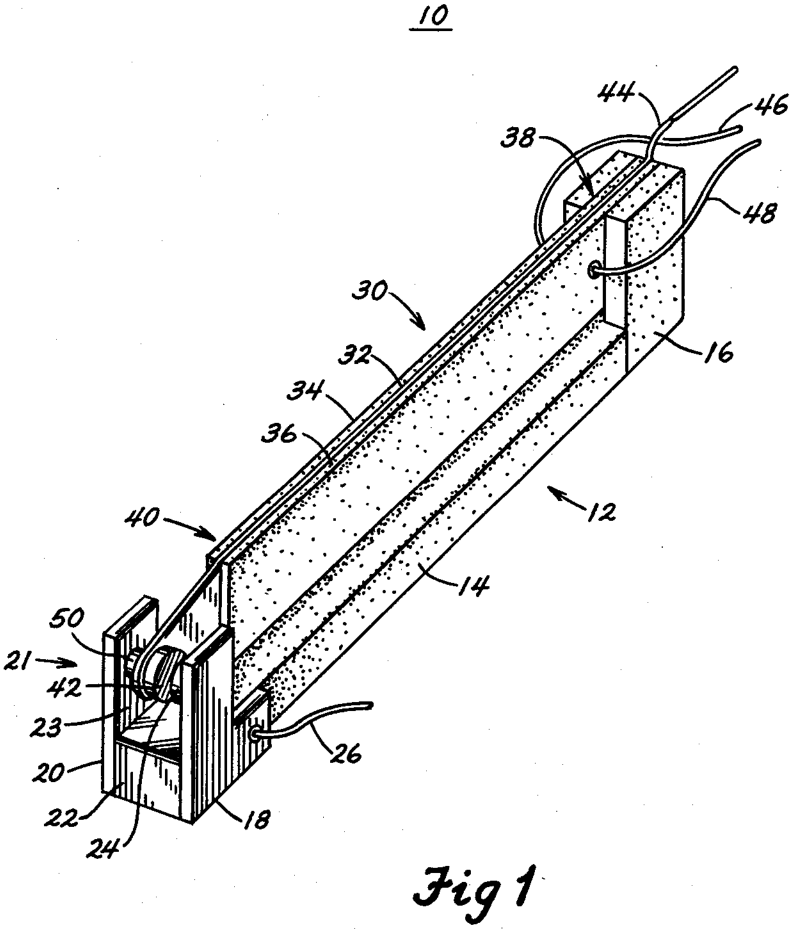
FIG. 1 is an axonometric view of a piezoelectric relay according to this invention.

There is shown in FIG. 1 a piezoelectric relay 10 according to this invention which includes a frame 12 comprising a plastic rail 14 and mounting block 16. Iron pole plates 18 and 20 are mounted at one end of rail 14 spaced from each other with permanent magnet 22 between them. Pole plate 18 carries stationary contact 24, which is electrically connected to pole plate 18 and externally connected through electrode 26. Piezoelectric bender 30 includes metal blade 32 sandwiched between piezoelectric plates 34 and 36. Bender 30 may have only one piezoelectric plate rather than two, as shown. Such benders, also known as non-symmetrical monolams, are capable of deflection in one direction only. Fixed portion 38 of bender 30 is mounted in mounting block 16. The movable portion 40 of bender element 30 carries movable contact 42 proximate stationary contact 24 of pole plate 18. Contact 42 is electrically connected to metal plate 32 and makes external connection through electrode 44. Drive voltage is applied to bender element 30 through electrodes 46 and 48, which are connected to piezoelectric members 34 and 36. Contacts 24 and 42 may include or wholly consist of magnetic materials such as iron or nickel. Element 50 may also be made of magnetic material to enhance the attraction to pole plate 20. Magnetic circuit 21 extends through permanent magnet 22, poles 18 and 20, gap 23, contacts 24 and 42, and element 50.

Piezoelectric plates 34 and 36 may have a length of 1.25 inches, width of 0.050 inch, thickness of 0.010 inch, and be made of piezoelectric materials such as lead titanate and lead zirconate. Contacts 42 and 24 may be solid or plated iron contacts of 0.25 inch diameter. Permanent magnet 22 may provide a field strength in the 0.015 inch gap between pole plates 18 and 20 and the moving element 50, 42, which provides a holding force of about 50 grams between pole 20 and element 50 in the contact open position or between contacts 42 and 24 in the closed position. To overcome this magnetic detent, the voltage required to be applied to electrodes 46 and 48 is 150 volts. Piezoelectric bender elements are variously known in the field as benders, bimorphs, polymorphs, and bilams, and more generally as benders, bender elements or bending elements. Although herein the bender elements have been shown as using a single metal blade sandwiched between two piezoelectric elements, this is not a necessary limitation of the invention, as monolams, single, one-sided layers or multiple layers may also be used. See U.S. patent application Ser. Nos. 222,649, filed Jan. 5, 1981; 270,370, filed June 4, 1981; and 300,025, filed Sept. 8, 1981.

Figure 2:
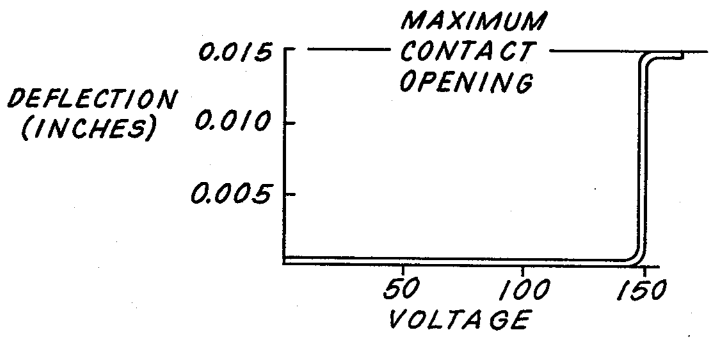
FIG. 2 illustrates the characteristic deflection with respect to applied voltage of the relay of FIG. 1.

The sharp action characteristic 60 of relay 10 is shown in FIG. 2, where an initial application of voltage produces no deflection of the movable contact until a predetermined voltage, for example 150 volts, is reached, at which point the magnetic detent force of 50 grams is abruptly and cleanly overcome and the contacts are snapped closed with a force approximately equal to the magnetic detent holding force. This sweeps movable portion 40 through the full range of the 0.015 inch gap between contacts 42 and 24.

Figure 3:
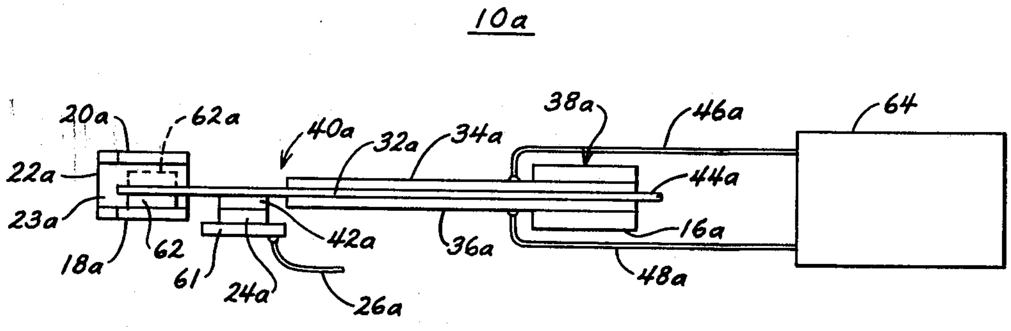
FIG. 3 is a schematic plan view in which the electrical contacts are separated from the magnetic circuit.

Although the embodiment in FIG. 1 shows the electrical contacts disposed in the magnetic circuit and being comprised partly or wholly of magnetic material, this is not a limitation of the invention. For example, in FIG. 3 contacts 42a and 24a need not be and are not magnetic material. Contact 42a is interconnected electrically through metal blade 32a to external electrode 44a. Contact 24a is mounted on support member 61 and is electrically connected through it to electrode 26a. In gap 23a, there is located an element 62 of magnetic material which, under the influence of the magnetic field, assists metal plate 32a to adhere to pole 20a in the open position and assists element 62 to adhere to pole 18a in the closed position, as shown in FIG. 3. Element 62 may as well be placed on the opposite side of metal blade 32a, as shown in phantom at 62a, or there may be such elements on both sides of metal blade 32a. In this way the magnetic detent circuit and the controlled electric circuit may be isolated. Rail 14 has been omitted for clarity in FIGS. 3-6. A means in addition to electrodes 46 and 48 for applying an actuating voltage, is illustrated in the form of a source of switching voltage 64, which will provide the necessary voltage, as shown for example in FIG. 2.

Figure 4:
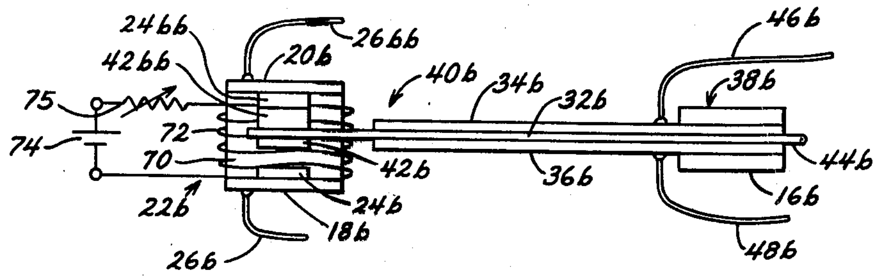
FIG. 4 is a schematic plan view for a double-pole, double-throw piezoelectric relay according to this invention utilizing an electromagnet.

The magnet that powers the magnetic circuit is not restricted to a permanent magnet. It may as well be an electromagnet 22b, as shown in FIG. 4, including a soft iron core 70 surrounded by winding 72 and energized by battery 74. By adjusting the current in coil 72 by means, for example, of variable resistor 75, it is possible to adjust the voltage at which the switching action occurs. It is also possible to use a combination of permanent magnet and electromagnet in order to reduce the amount of current required. FIG. 4 also illustrates a double-throw switch construction in which contacts 24b and 42b are complemented by a second set of contacts 24bb and 42bb.

Figure 5:
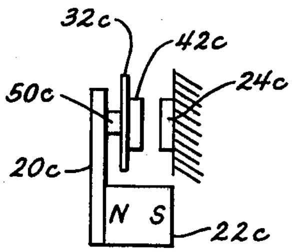
FIG. 5 is an end view of a portion of a piezoelectric relay according to this invention utilizing a single magnetic pole proximate the relay contacts.
Figure 6:
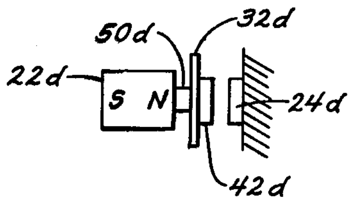
FIG. 6 is a view similar to FIG. 5 in which the magnet is located directly proximate one of the relay contacts without additional pole structure.

In certain constructions, if necessary and appropriate, one of the pole plates may be omitted so that only pole plate 20c, FIG. 5, remains, or both independent pole plates may be omitted with magnet 22d, FIG. 6, becoming the pole.

Other embodiments will occur to those skilled in the art and are within the following claims:

What is claimed is:

1. A magnetically detented piezoelectric relay comprising:

- a piezoelectric bender element having a fixed portion and a movable portion;
- means for providing an actuating voltage to deflect said bender element;
- first contact means mounted on said movable portion and second stationary contact means remote from said bender element and proximate said first contact means for selective engagement therewith in response to deflection of said bender element; and
- magnetic circuit means including an electromagnet, pole means, magnetic means on said movable portion for magnetically adhering said movable portion to said pole means until the deflection force of said bender element exceeds the holding force of said magnetic circuit, and means for varying the current to said electromagnet to control the voltage at which said bender element is actuated.

2. The piezoelectric relay of claim 1 in which said first and second contact means are in said magnetic circuit.

3. The piezoelectric relay of claim 2 in which said magnetic means is included in said first contact means.

4. The piezoelectric relay of claim 2 in which said second contact means is mounted on said pole means.

5. The piezoelectric relay of claim 4 in which said second contact means includes magnetic material.

6. The piezoelectric relay of claim 1 in which said means for providing an actuating voltage includes electrode means.

7. The piezoelectric relay of claim 6 in which said means for providing an actuating voltage further includes a voltage source.

8. The piezoelectric relay of claim 1 in which said first contact means includes a first contact member on said movable portion on the side facing said second contact means and a second contact member on the opposite side of said movable portion, and third contact means remote from said bender element and proximate said second contact member for selective engagement therewith.

9. The piezoelectric relay of claim 1 in which said pole means includes a single pole member on one side of said movable portion proximate said magnetic means.

10. The piezoelectric relay of claim 1 in which said pole means includes a pair of spaced pole members for receiving in the space said movable portion bearing said magnetic means.

11. A magnetically detented piezoelectric relay comprising:

a piezoelectric bender element having a fixed portion and a movable portion;

means for providing an acutuating voltage to deflect said bender element;

first contact means mounted on said movable portion and second stationary contact means remote from said bender element and proximate said first contact means for selective engagement therewith in response to deflection of said bender element, said first contact means including a first contact member on said movable portion on the side facing said second contact means and a second contact member on the opposite side of said movable portion, and third contact means remote from said bender element and proximate said second contact member for selective engagement therewith; and magnetic circuit means including a magnet, pole means, magnetic means on said movable portion for magnetically adhering said movable portion to said pole means until the deflection force of said bender element exceeds the holding force of said magnetic member, said second contact means being mounted on said pole means, and means for varying the current to said electromagnet to control the voltage at which said bender is actuated.

12. A magnetically detented piezoelectric relay comprising:

a piezoelectric bender element having a fixed portion and a movable portion;

means for providing an actuating voltage to deflect said bender element;

first contact means mounted on said movable portion and second stationary contact means remote from said bender element and proximate said first contact means for selective engagement therewith in response to deflection of said bender element; and magnetic circuit means including a permanent magnet and an electromagnet, pole means, magnetic means on said movable portion for magnetically adhering said movable portion to said pole means until the deflection force of said bender element exceeds the holding force of said magnetic circuit, and means for varying the current to said electromagnet to control the voltage at which said bender element is actuated.

* * * * *